United States Patent [19]

Kimura et al.

[11] Patent Number: 4,612,561
[45] Date of Patent: Sep. 16, 1986

[54] PARALLEL-CONNECTED GATE TURN-OFF THYRISTORS

[75] Inventors: Shin Kimura; Hiroshi Fukui, both of Hitachi; Shinji Yamada, Ichihara; Shuji Musha; Masayoshi Sato, both of Hitachi, all of Japan

[73] Assignee: Hitachi, Ltd., Tokyo, Japan

[21] Appl. No.: 508,727

[22] Filed: Jun. 27, 1983

[30] Foreign Application Priority Data

Jun. 25, 1982 [JP] Japan ............................ 57-110339

[51] Int. Cl.⁴ .................. H01L 29/74; H03K 17/60; G01R 00/00; H02M 00/00
[52] U.S. Cl. ..................... 357/38; 307/252 J; 307/252 K; 307/252 Q; 307/305; 328/155; 324/158 SC; 363/70
[58] Field of Search .......... 307/252 J, 252 R, 252 Q, 307/305; 328/155; 324/158 SC; 363/70; 357/38

[56] References Cited

U.S. PATENT DOCUMENTS

| | | | |
|---|---|---|---|
| 3,633,046 | 1/1972 | Dewey | 307/252 Q |
| 3,662,250 | 5/1972 | Piccone et al. | 307/252 Q |
| 3,743,859 | 7/1973 | Exner | 307/252 Q |
| 4,231,054 | 10/1980 | Ruetsch et al. | 357/38 |

OTHER PUBLICATIONS

Gutzwiller et al., "Series and Parallel Operation of SCR's" *General Electric Controlled Rectifier Manual,* First Edition, (1960), pp. 76-81.

*Primary Examiner*—Andrew J. James
*Assistant Examiner*—R. P. Limanek
*Attorney, Agent, or Firm*—Antonelli, Terry & Wands

[57] ABSTRACT

A parallel connected gate turn-off thyristor device including an additional short circuiting conductor connected between the gate terminals of the respective gate turn-off thyristors so as to bypass a part of the turn-on and turn-off gate currents of one gate turn-off thyristor to other gate turn-off thyristors to increase the turn-on and turn-off gate currents of the other gate turn-off thyristors thereby hastening the turn-on and turn-off operations of the other gate turn-off thyristors.

3 Claims, 13 Drawing Figures

PARALLEL-CONNECTED GATE TURN-OFF THYRISTORS

BACKGROUND OF THE INVENTION

The present invention relates to parallel-connected gate turn-off thyristors (GTOs), and in particular to a parallel-connected GTO which is suitable for almost matching the turn-on and turn-off operations of each element of GTOs connected in parallel.

In general, each of GTOs connected in parallel has slightly different characteristics. Therefore, even when equal gate currents are applied to them, they sometimes do not start to operate simultaneously. In other words, when they are turned on, some of them turn on quickly and the remaining elements are delayed. When being turned off, some of them turn off quickly and again the remaining elements are delayed. In this case, an overcurrent flows temporarily into a GTO which has turned on or turned off quickly, and this means that such a GTO deteriorates and can even break down.

SUMMARY OF THE INVENTION

It is an object of the present invention to provide parallel-connected GTOs which do not show any deterioration or breakdown of the GTOs connected in The present invention discloses a device in which at least the gate terminals or cathode terminals of parallel-connected GTOs are connected mutually to conductors.

Such a connection makes a current unbalance coefficient during the turning on or off of the parallel GTOs very small. In other words it makes the delay between the turning on or off of the parallel GTOs almost zero, and does not allow any overcurrent to flow in only some of the GTOs. Accordingly, parallel-connected GTOs do not show any deterioration and also do not break down. These principles will be explained below.

DESCRIPTION OF THE PREFERRED EMBODIMENTS

Figure 1:
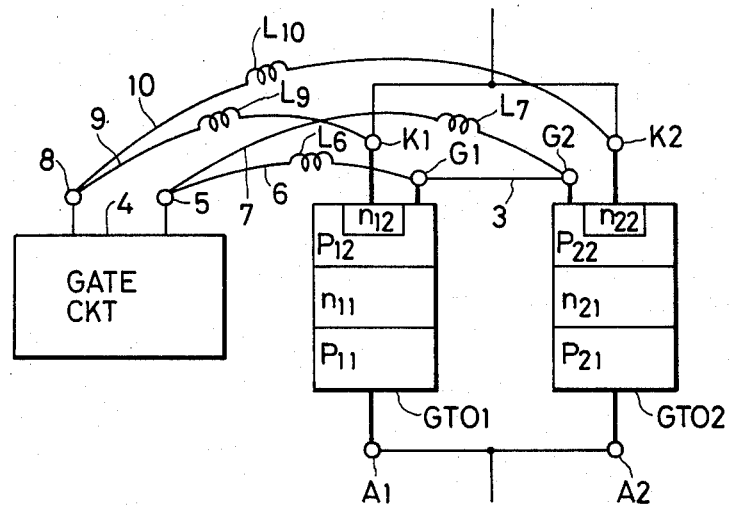
FIG. 1 shows a circuit diagram of one embodiment of the present invention.

FIG. 1 shows a principle of the present invention wherein the gate terminals of a pair of GTOs are connected together by a conductor. In this figure, GTO 1 and GTO 2 are each composed of pnpn junctions and anode terminals A1, A2 thereof are connected to $p_{11}$, $p_{21}$ layers, gate terminals G1, G2 to $p_{12}$, $p_{22}$ layers, and cathode terminals K1, K2 to $n_{12}$, $n_{22}$ layers. The GTOs are connected in parallel by connecting the anode terminals A1, A2 together and the cathode terminals K1, K2 together. In this figure, the gate terminals G1 and G2 are connected by a lead wire 3, the function of which will be explained later. Meanwhile, a terminal 5 of a gate circuit 4 is connected to both of the gate terminals G1 and G2 by lead wires 6 and 7, respectively, and a terminal 8 thereof is connected to both the cathode terminals K1 and K2 by lead wires 9 and 10, respectively. $L_6$, $L_7$, $L_9$, $L_{10}$ are wiring inductances, that of the conductor 3 is omitted because it is so small it can be neglected.

These parallel-connected GTOs are turned on when a on-gate current is applied from the gate circuit 4 through the routes, "4-5-6-G1-$p_{12}$-$n_{12}$-K1-9-8-4" and "4-5-7-G2-$p_{22}$-$n_{22}$-K2-10-8-4". Both GTO 1 and GTO 2 turn on but in practice there is a delay between the turn-on operations of the two GTOs because of the difference in characteristics thereof. If GTO 1 turns on more quickly than GTO 2, the anode current flowing into GTO 1 is of a higher level than that flowing into GTO 2, causing the potential of the $p_{12}$ layer to become higher than that of the $p_{22}$ layer. This means that the impedance between G1 and K1 becomes larger than that between G2 and K2. Accordingly, part of the on-gate current input to G1 is by-passed quickly to G2 by the conductor 3. Thereby, the on-gate current input to G2 increases rapidly, hastening the turn-on operation of GTO 2. In this way, the subsequent turn-on operations of the two GTOs are made to match rapidly. If the conductor 3 is not provided, the on-gate current is output and received by the lead wires 6, 7 with the wiring inductances $L_6$ and $L_7$. As a result, the turn-on operation is comparatively slow when compared to the turn-on operation when the conductor 3 is provided.

The parallel-connected GTOs can be turned off when an off-gate current is applied thereto from the gate circuit 4 via the routes, "4-8-9-K1-$n_{12}$-$p_{12}$-G1-6-5-4" and "4-8-10-K2-$n_{22}$-$p_{22}$-G2-7-5-4". Both GTOs 1 and 2 turn off, but in practice there is a delay between the turn-off operations of the two GTOs because of the difference in characteristics thereof. If the turn-off operation of GTO 1 is quicker than that of GTO 2, the reverse breakdown voltage between G1 and K1 recovers more quickly than that between G2 and K2. This means that the impedance between G1 and K1 becomes larger more quickly than that between G2 and K2. Accordingly, the off-gate current extracted from $p_{12}$ to G1 decreases rapidly, while the offgate current extracted from $p_{22}$ to G2 increases rapidly. Such a quick change in the off-gate current results from its quick transmission and reception via the conductor 3. In this way, the subsequent turnoff operations of the two GTOs are made to match rapidly. If the conductor 3 is not provided, changes in the off-gate current are suppressed by the wiring inductances $L_6$, $L_7$ of the lead wires 6, 7, and they inevitably become slower.

Figure 2:
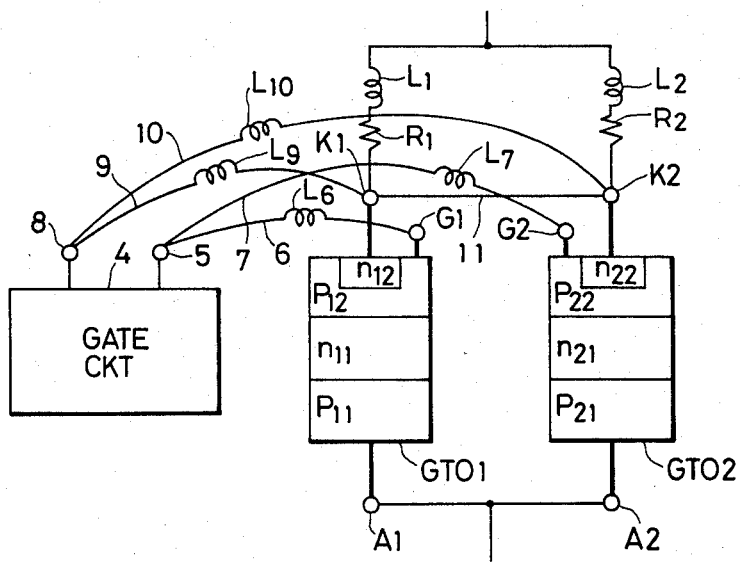
FIG. 2 shows a circuit diagram of another embodiment of the present invention.

FIG. 2 shows the principle of the present invention wherein the cathode terminals of a pair of GTOs are connected together by a conductor 11. The reference numbers in this figure correspond to the components given the same reference numbers in FIG. 1. In this figure, the wiring inductances $L_1$ and $L_2$ on the cathode side and the wiring resistances $R_1$ and $R_2$ thereof are also considered. The parallel-connected GTOs are turned on when the on-gate current is applied along the same routes as those of the embodiment of FIG. 1. GTO 1 turns on more quickly than GTO 2, the impedance between G1 and K1 becomes larger than that between G2 and K2 for the reason given above. Accordingly, the on-gate current extracted from $n_{12}$ drops rapidly and the on-gate current extracted from $n_{22}$ similarly increases rapidly. Such a sudden change results from the rapid transmission and reception of the on-gate current via the conductor 11. In this way, the turn-on operations of the two GTOs are made to match rapidly. If the conductor 11 is not provided, the changes in the on-gate current is suppressed by the wiring inductances $L_1$, $L_2$ and resistances $R_1$, $R_2$ on the cathode side and become slower. The parallel-connected GTOs are turned off when an off-gate current is applied along the same routes as those of the embodiment of FIG. 1. If GTO 1 is turned off more quickly than GTO 2, the impedance between G1 and K1 becomes larger more quickly than that between G2 and K2, for the same reason as given above. Therefore, the off-gate current input to K1 is by-passed quickly to K2 via the conductor 11. So that the off-gate current input to K2 increases rapidly, hastening the turn-off operation of GTO 2. As explained above, the turn-off operations of the two GTOs are made to match rapidly. If the conductor 11 is not provided, the gate current is transmitted or received via the wiring inductances $L_1$, $L_2$ and the wiring resistances $R_1$, $R_2$ on the cathode side, and accordingly the turn-off operation becomes slower than that carried out when the conductor 11 is provided.

According to the methods of FIGS. 1 and 2, the turn-on and turn-off operations of the parallel-connected GTOs almost match each other, thereby preventing the deterioration and breakdown of the GTOs. Of course, the conductors 3, 11 may be connected to both the gate terminals and the cathode terminals. In this case the term gate terminal or cathode terminal means the entire length of such a terminal from the root to the end thereof. The terminal 5 or terminal 8 of the gate circuit 4 may be connected to the gate terminals G1, G2 or to the cathode terminals K1, K2 via the conductor 3 or 11 instead of a direct connection thereto.

Figure 3A:
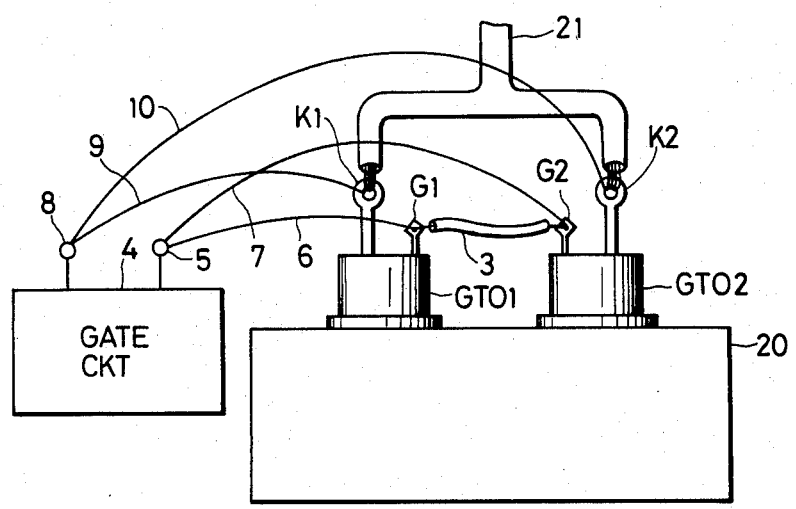
FIG. 3(A) and 3(B) show side elevations of two embodiments of the present invention relating to the circuit diagram shown in FIG. 1.
Figure 3B:
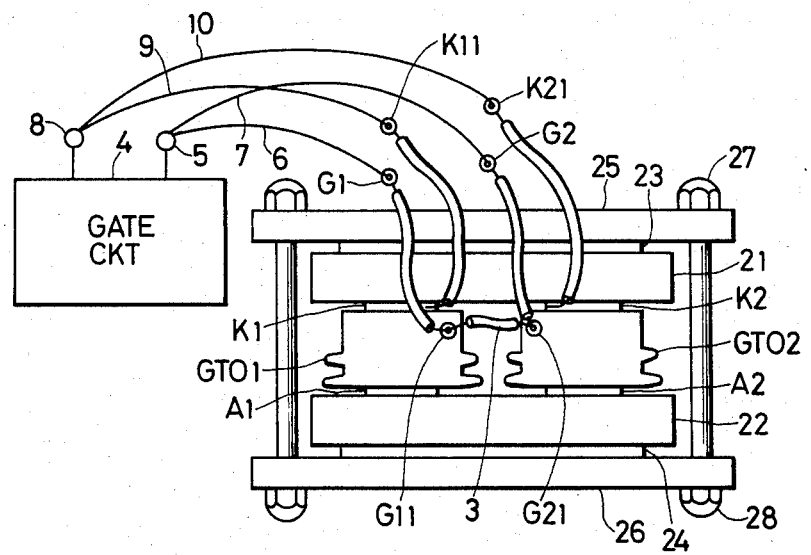

FIG. 3 is side elevations of element mountings of the embodiment of the present invention relating to the parallel-connected GTOs shown in FIG. 1. The reference numbers in this figure each correspond to the components given the same reference numbers in FIG. 1. FIG. 3(A) shows the side elevation of a pair of parallel-connected stud-type GTOs. The anode terminals A1, A2 of GTO 1 and GTO 2 are buried within a cooling fin 20, the cathode terminals K1, K2 are connected togehter by a insulated lead wire 21 and extend to an external terminal (not shown). The gate terminals G1-G2 are connected by the conductor 3. FIG. 3(B) shows the side elevation of a pair of parallel-connected flat GTOs, GTO 1 and GTO 2, which are tightened with bolts 27, 28 from both sides via cooling fins 21, 22, insulating plates 23, 24 and holding plates 25, 26. With these flat GTOs, auxiliary cathode terminals K11, K21 are provided for applying a cathode current, in addition to the cathode terminals K1, K2 for the main circuit. The conductor 3 may be connected between the end points of the gate terminals G1 and G2 but a better effect can be obtained when it is connected between the roots thereof, as shown in the figure.

Figure 4A:
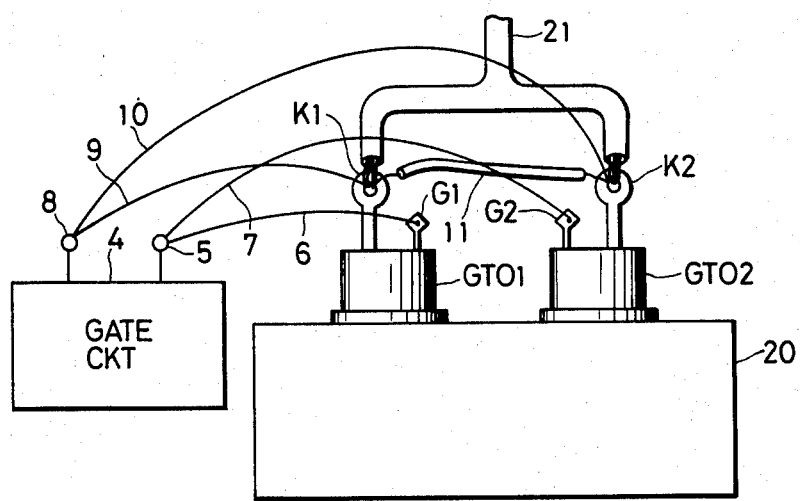
FIG. 4(A) and 4(B) show side elevations of two embodiments of the present invention relating to the circuit diagram shown in FIG. 2.
Figure 4B:
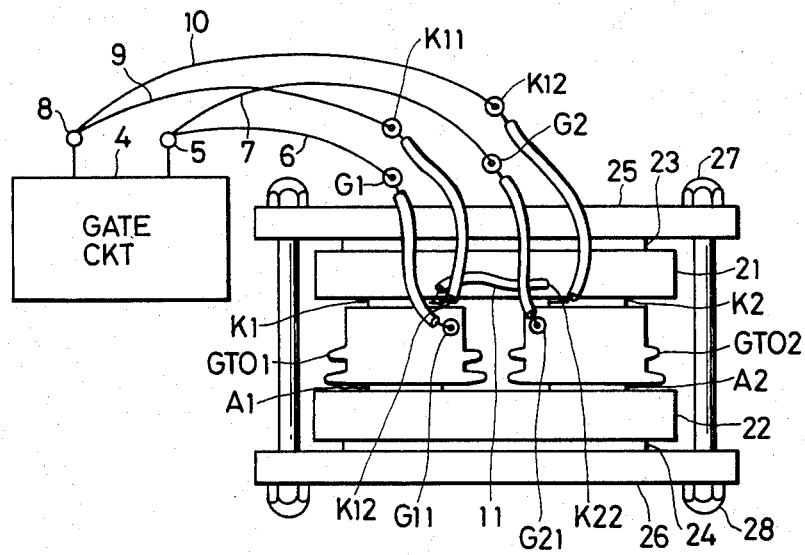

FIG. 4 is side elevations of element mountings of the embodiment of the present invention relating to the parallel-connected GTOs shown in FIG. 2. The reference numbers of this figure correspond to the same components given the same reference numbers in FIG. 3. FIG. 4(A) shows, unlike FIG. 3(A), the cathode terminals K1 and K2 connected by the conductor 11. FIG. 4(B) shows, unlike FIG. 3(B), root portions K12 and K22 of the auxiliary cathode terminals K11, K21 connected by the conductor 11. The conductor can, of course, be also connected between K11 and K21.

Figure 5A:
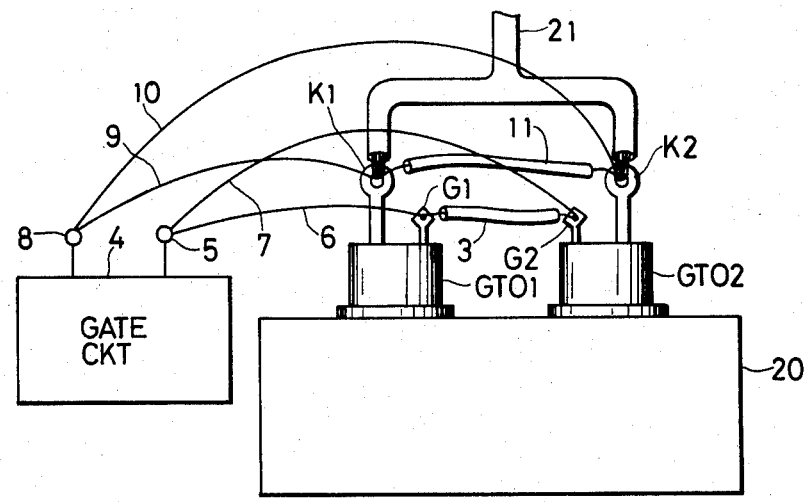
FIG. 5(A) and 5(B) show side elevations of further embodiments of the present invention.
Figure 5B:
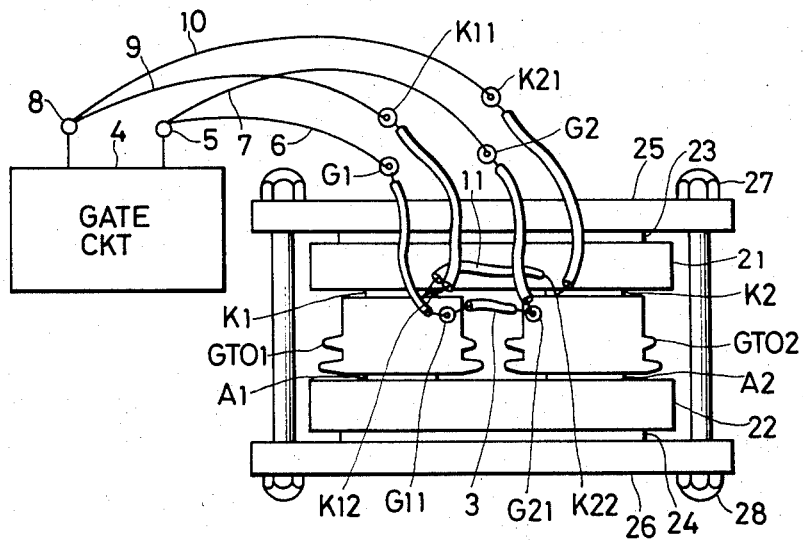

FIG. 5 is side elevations of element mountings of an embodiment of the present invention wherein the gate terminals and the cathode terminals of a pair of GTOs are each connected together by the conductors 3 and 11. The reference numbers correspond to the components given the same reference numbers in FIGS. 3 and 4. In FIG. 3 to FIG. 5(A), (B), stud-type and flat GTOs are shown, but the present invention can also be applied to other types of GTOs.

Figure 6:
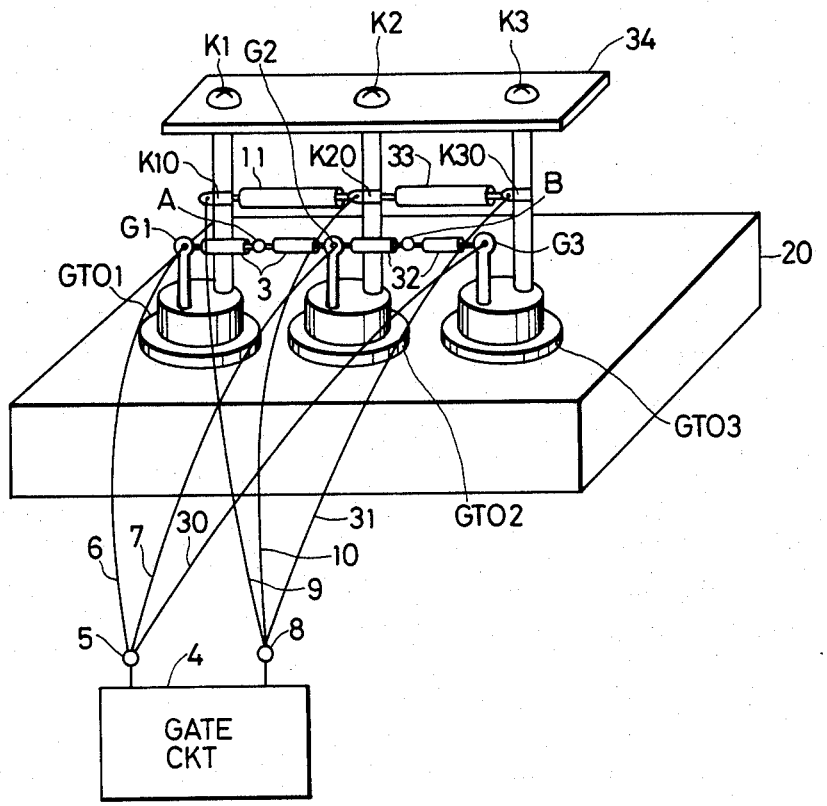
FIG. 6, FIG. 7 and FIG. 8 respectively shown perspective views of still further embodiments of the present invention relating to three parallel connected GTOs.

FIG. 6 is a perspective view of an element mounting of an embodiment of the present invention wherein the gate terminals and cathode terminals of three GTOs are each connected together by conductors 3, 11, 32 and 33. The reference numbers correspond to the components given the same reference numbers in FIG. 5. In this figure, GTO 3 is added, the anode terminal of which is buried within the cooling fin 20 and the cathode terminal K3 is connected to K1, K2 by the cathode 34. The gate terminal G3 thereof is connected to terminal 5 of the gate circuit 4 by a lead wire 30. The gate terminals G1 and G2 are connected by the conductor 3, and G2 and G3 are connected by the conductor 32. When midpoints A, B of the conductors 3, 32 and terminal 5 of gate circuit 4 are each connected by lead wires, the lead wires 6, 7, and 30 may be omitted. Intermediate points K10, K20 of the cathode terminals K1 and K2 are connected by the conductor 11, and intermediate points K20 and K30 of K2 and K3 by the conductor 33. The intermediate points K10, K20, K30 are connected by the lead wires 9, 10, 31, respectively, to terminal 8 of the gate circuit 4.

Figure 7:
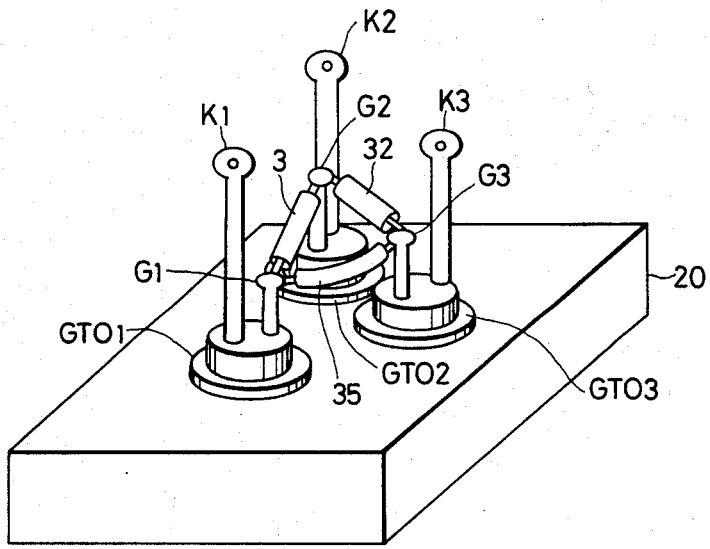
Figure 8:
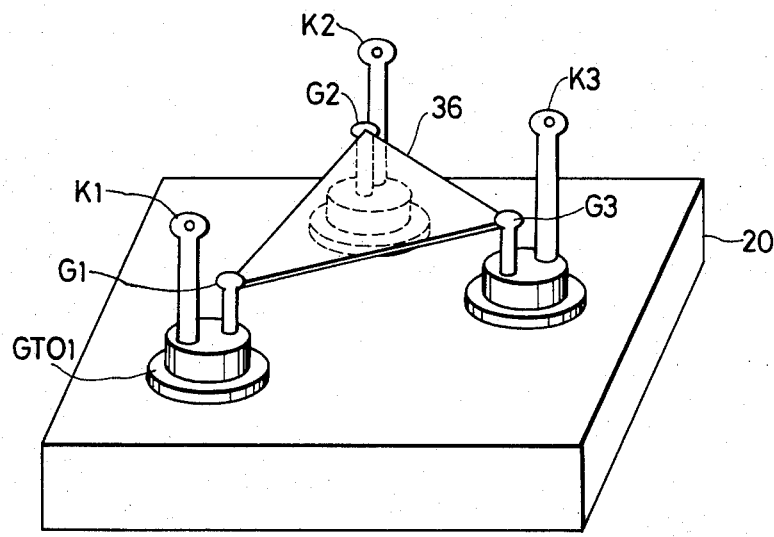

FIG. 7 and FIG. 8 show embodiments of the present invention wherein three GTOs are arranged at the apexes of a triangle. The reference numbers correspond to the components given the same reference numbers in FIG. 6. In these figures only the gate terminals are shown, the other parts not related are omitted in order to help explain the method of connection. In FIG. 7, the gate terminals G1, G2 and G3 are connected together by conductors 3, 32, 35 in the form of a triangle, but they may be also connected in the form of a star. In FIG. 8, the gate terminals G1, G2, G3 are connected together by a conductor 36. The conductor 36 consists of a conductive plate, and it is sufficient to connect a point on the conductive plate to terminal 5 of the gate circuit 4 by a lead wire. In FIG. 7 and FIG. 8, methods of connecting the gate terminals are shown, the same methods can also be applied to the cathode terminals.

Figure 9:
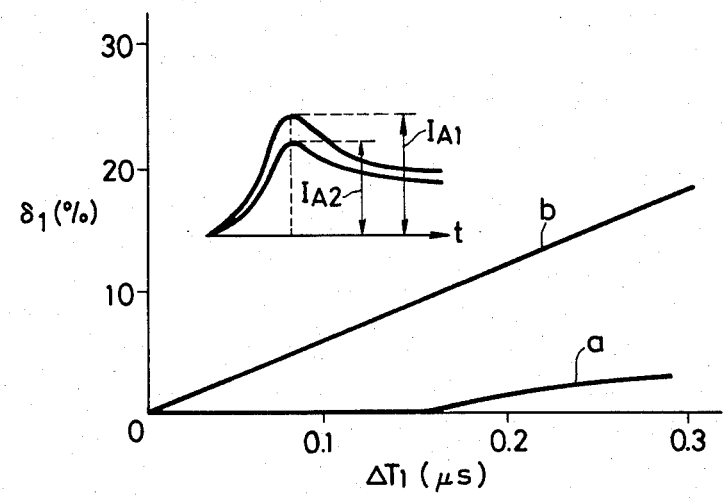
FIG. 9 shows a relationship between a turn-on time difference and a current unbalance coefficient for the present invention and for the conventional parallel connected GTOs.
Figure 10:
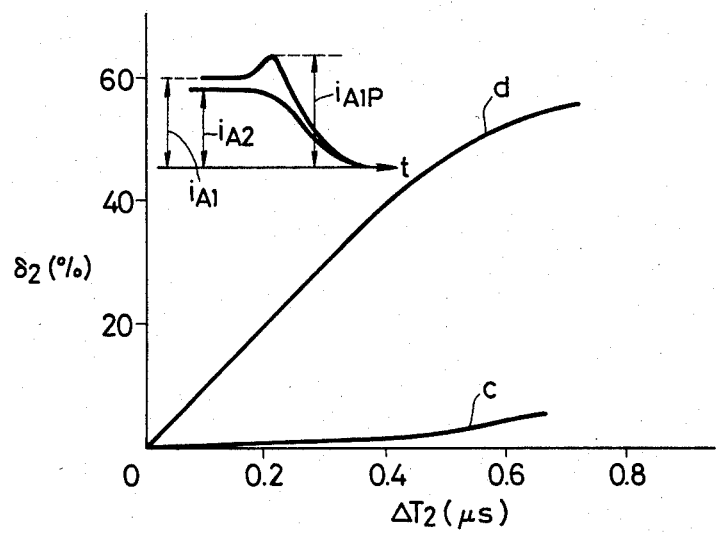
FIG. 10 shows a relationship between a turn-off time difference and a current unbalance coefficient for the present invention and for the conventional parallel connected GTO.

FIG. 9 and FIG. 10 are experimental data showing the effects of the present invention. In this experiment, a pair of GTOs having a current capacity of 200A were connected in parallel as shown in FIG. 3(A) and a current with a peak to peak value of 400A was applied to these parallel-connected GTOs. The difference $\Delta T_1$ ($\mu$s) in the delayed turn-on in the individual elements of the two GTOs is plotted along the horizontal axis of FIG. 9, while a current unbalance coefficient $\delta HD\ 1$ (%) during turn-on is plotted along the vertical axis. $\delta_1$ is expressed by the following relationship:

$$\delta_1 = [(|I_{A1} - I_{A2}|)/(I_{A1} + I_{A2})] \times 100 \; (\%)$$

Where $I_{A1}$, $I_{A2}$ were the peak values of the anode current flowing through each GTO as it turned on, as shown in FIG. 9. The present invention provided the characteristic shown by the curve a that $\delta_1$ was almost zero when $\Delta T_1$ was 0.15 μs, and $\delta_1$ was at most about 3% even when $\Delta T_1$ exceeded 0.25 μs. On the other hand, when the gate terminals were not connected by the conductor 3, the characteristic shown by the curve b was obtained. In this case, the value of $\delta_1$ became very large when compared with that in the curve a.

In FIG. 10, the difference $\Delta T_2(\mu s)$ in the turn-off times of individual elements of the two GTOs is plotted along the horizontal axis, while the current unbalance coefficient $\delta_2 (\%)$ of the turn-off time is along the vertical axis. $\delta_2$ is expressed by the following relationship:

$$\delta_2 = (i_{A1P} - i_{A1})/i_{A1} \times 100 \; (\%)$$

where $i_{A1P}$ was the peak value during the turn-off of a GTO, and $i_{A1}$ was the anode current when it was conductive, as shown in FIG. 10. The present invention provided the characteristic shown by the curve c that $\delta_2$ was almost zero when $\Delta T_2$ was 0.3 μs, and $\delta_2$ was at most about 4% even when $\Delta T_2$ exceeded 0.6 μs. When the gate terminals were not connected with the conductor 3, the characteristic indicated by the curve d was obtained. It is obvious from this characteristic that $\delta_2$ became very large when compared with that of the curve c. The above results were obtained from an experiment conducted with the structure shown in FIG. 3(A), the similar results have also been obtained for other embodiments.

We claim:

1. A parallel connected gate turn-off thyristor device comprising:
   a plurality of gate turn-off thyristors connected in parallel;
   a common gate circuit connected between the gate and cathode terminals of said respective gate turn-off thyristors for supplying turn-on and turn-off gate currents to said respective gate turn-off thyristors; and
   a short circuiting means for short circuiting at least either the respective gate terminals or the respective cathode terminals of said respective gate turn-off thyristors, whereby the turn-on and turn-off gate currents supplied from said common gate circuit to one gate turn-off thyristor which has turned on or turned off earlier is transferred through said short circuiting means to other gate turn-off thyristors which are not yet turned on or turned off so that the turn-on and the turn-off gate currents to the other gate turn-off thyristors are increased and the turn-on and turn-off operations of the other gate turn-off thyristors are hastened.

2. A parallel connected gate turn-off thyristor device according to claim 1 wherein the connection of said short circuiting means to the respective gate terminals and the respective cathode terminals of said respective gate turn-off thyristors is made near the root portions thereof so that the inductance of said short circuiting means is minimized.

3. A parallel connected gate turn-off thyristor device comprising:
   a plurality of gate turn-off thyristors connected in parallel;
   a short circuiting conductor connected between gate terminals of said respective gate turn-off thyristors; and
   a common gate circuit connected between the gate and cathode terminals of said respective gate turn-off thyristors for supplying turn-on and turn-off gate currents thereto, one terminal of said common gate circuit is connected to the mid point of said short circuiting conductor, and the other terminal of said common gate circuit is connected to the cathode terminals of said respective gate turn-off thyristors, whereby the turn-on and turn-off gate currents supplied from said common gate circuit to one gate turn-off thyristor which has turned on or turned off earlier is transferred through said short circuiting conductor to other gate turn-off thyristors which are not yet turned on or turned off so that the turn-on and turn-off gate currents to the other gate turn-off thyristors are increased and the turn-on and turn-off operations of the other gate turn-off thyristors are hastened.

* * * * *